United States Patent
Luy et al.

(10) Patent No.: US 6,255,674 B1
(45) Date of Patent: Jul. 3, 2001

(54) SILICON-GERMANIUM HETEROBIPOLAR TRANSISTOR WITH A STEP-WISE GRADED BASE

(75) Inventors: Johann-Friedrich Luy, Ulm; Helmut Jorke, Gerstellen, both of (DE)

(73) Assignee: DaimlerChrysler AG, Stuttgart (DE)

( * ) Notice: Subject to any disclaimer, the term of this patent is extended or adjusted under 35 U.S.C. 154(b) by 0 days.

(21) Appl. No.: 09/323,141

(22) Filed: Jun. 1, 1999

(30) Foreign Application Priority Data

May 29, 1998 (DE) .............................. 198 24 110

(51) Int. Cl.$^7$ ................................................ H01L 29/737
(52) U.S. Cl. ..................... 257/198; 257/197; 257/26; 257/592; 257/616
(58) Field of Search ..................... 257/197, 592, 257/616, 198, 26

(56) References Cited

U.S. PATENT DOCUMENTS

| | | | |
|---|---|---|---|
| 5,006,912 | * | 4/1991 | Smith et al. ............................ 357/34 |
| 5,047,365 | * | 9/1991 | Kawanaka et al. ................... 437/132 |
| 5,177,025 | * | 1/1993 | Turner et al. .......................... 437/31 |
| 5,304,816 | * | 4/1994 | Grinberg et al. ...................... 257/26 |
| 5,329,144 | * | 7/1994 | Luryi .................................... 257/197 |
| 5,422,502 | * | 6/1995 | Kovacic ............................... 257/197 |
| 5,721,438 | * | 2/1998 | Tang et al. ........................... 257/197 |

FOREIGN PATENT DOCUMENTS

| | | |
|---|---|---|
| 06 00 643 A2 | 11/1993 | (EP) . |
| 06 21 642 A2 | 4/1994 | (EP) . |

OTHER PUBLICATIONS

Patton et al., "75–GHz fT SiGe–Base Heterojunction Bipolar Transistors," IEEE Elec. Dev. Lett., vol. 11, No. 4, Apr. 1990.*

* cited by examiner

Primary Examiner—Jerome Jackson, Jr.
(74) Attorney, Agent, or Firm—Venable; Norman N. Kunitz

(57) ABSTRACT

A silicon-germanium heterobipolar transistor has a silicon emitter 1, a silicon-germanium base 2 and a silicon collector 3 such that, starting from the emitter 1, the base 2 includes a change in the Ge content in the form of a step-wise increase, and a likewise step-wise, but opposing, change in the doping concentration, with a step height that is larger, seen in terms of energy, than the energy of the optical phonon energy of the semiconductor material.

4 Claims, 2 Drawing Sheets

SILICON-GERMANIUM HETEROBIPOLAR TRANSISTOR WITH A STEP-WISE GRADED BASE

CROSS-REFERENCE TO RELATED APPLICATION

This application claims the priority of German Patent Application No. 198 24 110.0 filed May 29, 1998, the subject matter of which is incorporated herein by reference.

BACKGROUND OF THE INVENTION

The invention relates to a silicon-germanium hereto bipolar transistor, having a silicon emitter, a silicon germanium base, and a silicon collector.

To this point, only diode oscillators have been significant in generating high-frequency power. In contrast, transistors have been considered unsuitable for such oscillators because of the relatively high base path resistance (S. Luryi, "Ultrafast operation of heterostructures [sic] bipolar transistors resulting from coherent base transport of minority carriers," Proc. ISDRS '93, Charlottesville, 1993, p. 59).

FIG. 1 schematically illustrates the function of a pin velocity-modulated diode, by way of the electrical field distribution E in the p emitter 1, the i drift zone 2 and the n collector 3, as a typical example of a diode oscillator. The surface charge of the drifting electrons divides the drift space into a region of higher field intensity in front of the drifting electrons, and a region of lower field intensity behind the electrons. With a constant emitter-collector potential, the field intensities increase steadily on both the emitter and collector sides during the electron drift. Because the field intensities decrease inside the emitter 1 and the collector 3, this increase means a discharge of electrons in the n region and a discharge of defect electrons in the p region. This influence current can be measured in the external electric circuit during the electron drift. According to FIG. 2, analogous considerations also apply to the bipolar transistor if the desired phase shift of the collector current is effected by the transit time in the base-collector space-charge zone. The influence current then flows in the base-collector circuit. The relatively high base resistance (typically>50Ω) is present in this circuit, however, so this configuration is unsuitable for a damping reduction of an external resonating circuit.

To this point, silicon-germanium bipolar transistors have become known from DE 42 41 609, DE 43 01 333 and DE 196 17 030; they include only a base having a uniform doping and germanium concentration, or a simple variation in the doping or germanium concentration, which results in a high base resistance and therefore the described disadvantage.

SUMMARY OF THE INVENTION

It is the object of the invention to provide a bipolar Si/Si/Ge heterotransistor structure in which the finite transit time of the charge carrier is utilized to generate a negative initial resistance in the base, and the in-phase components of the influence current are minimized in the emitter-collector circuit.

The above object generally is achieved according to the present invention by a silicon-germanium heterobipolar transistor having a silicon emitter, a silicon-germanium base and a silicon collector, wherein starting from the emitter, the base includes a change in the Ge content in the form of a step-wise increase, and a step-wise, but decreasing change in the doping concentration. Advantageous embodiments and modifications of the invention are disclosed and discussed.

The silicon-germanium bipolar transistor of the invention includes a change in the Ge content, which starts from the emitter and increases step-wise in the region of the base, alone or with a likewise step-wise, but opposing, change in the doping concentration, with a step height that causes step heights to occur which, seen in terms of energy, are larger than those of the optical phonon energy of the semiconductor material.

A step-wise increase in the Ge content is especially advantageous in connection with an opposing, likewise stepped change in the doping concentration.

Typically, the base has three to seven steps with a total thickness of 50 to 300 nm. The germanium content is preferably between 6 and 30%, and the doping in the case of p doping has a concentration between $8\times10^{19}$ and $5\times10^{18}$ $cm^{-3}$.

A particular advantage of the invention is that the diffusion in the base of a transistor structure, which is normally non-directional, is directed through the graduation in the germanium concentration or the doping concentration, including the combination of the two, in the base.

The invention is described below by way of advantageous embodiments with reference to schematic drawings in the figures.

DETAILED DESCRIPTION OF THE PREFERRED EMBODIMENT

Figure 1:
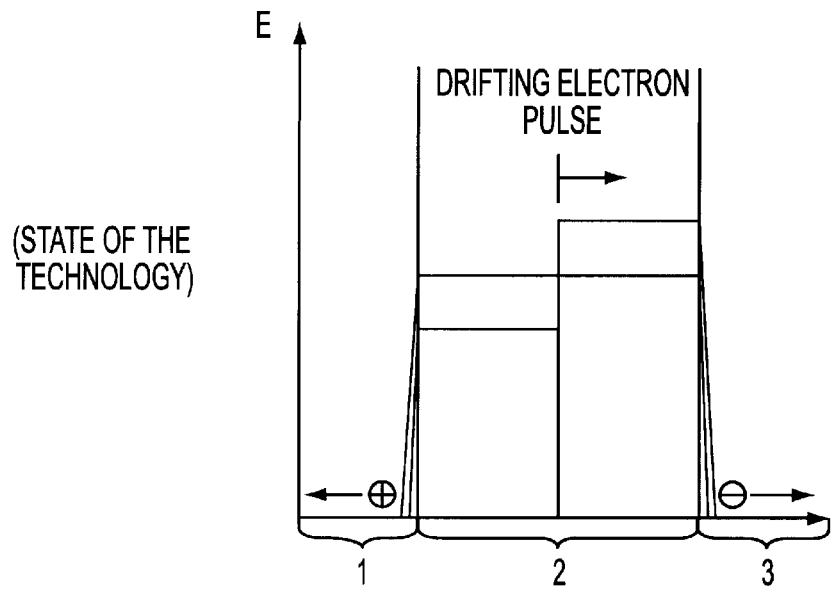
FIG. 1 shows the electrical field distribution in a pin velocity-modulated diode (state of the technology).

In the illustrated embodiment, a stepped variation in the germanium concentration or a stepped variation in the doping concentration attains a stepped course of the conductance-band minimum in the region of the base with a virtually constant step height $\Delta$. If $\Delta$ is selected to be larger than the energy of the optical phonons, a rapid thermalization of the electrons occurs during the transition to the next, energetically lower step.

The transit time $\Delta\tau$ within a step can be described with the following diffusion relationship:

$$\Delta\tau = \frac{\Delta W^2}{2D_n}$$

($\Delta W$ ... step width, $D_n$ ... electron diffusion constant).

The entire base transit time $\tau_B$ over all steps is then:

$$\tau_B = N\Delta\tau = \frac{N\Delta W^2}{2D_n},$$

where N ... step number.

With Ge contents of 0%, the optical phonon energy in silicon-germanium layers is at 63 meV, and at 37 meV with a 100% Ge content, and can be linearly extrapolated for Ge contents between these two values.

In high-level injections, the entire emitter-collector transit time essentially comprises the base transit time $\tau_B$ and the collector transit time. The selection of a sufficiently thin collector layer makes the collector transit time negligibly small in comparison to the base transit time. The finiteness of the base transit time leads to a phase shift between the time-dependent emitter-base potential $U_{EB}$ and the collector current $I_C$. If the phase shift is sufficiently large, the transistor can exhibit a negative output resistance if the parasitic resistances are low enough, which can be utilized for a damping reduction of a resonant circuit.

With $D_n=5$ cm$^2$/s and N=5, the necessary total base width can be estimated at about 200 nm for the frequencies of the V band (50–75 GHz). A graduation of the conductance-band course under the condition that $\Delta$ is larger than the energy of the optical phonons can be effected in principle through a graduation of the germanium concentration and the doping concentration.

The height of the energy level in a variation $\Delta x$ of the germanium concentration follows approximately from $\Delta = 0.74\ \Delta x$.

The height of the energy level in a variation of the doping concentration follows approximately from $\Delta = kT \ln(N_i/N_{i+1})$, where k ... Boltzmann constant and T ... absolute temperature.

Table 1 lists exemplary values for the energy levels due to the variation $\Delta x$ of the germanium concentration and the doping concentration.

TABLE 1

| | Energy levels: | | |
|---|---|---|---|
| $\Delta x$ (%) | $\Delta$ (meV) | $N_i/N_{i+1}$ | $\Delta$ (meV) |
| 3 | 22 | 2 | 18 |
| 4 | 30 | 3 | 29 |
| 5 | 37 | 5 | 41 |
| 6 | 44 | 10 | 58 |
| 7 | 52 | | |
| 8 | 59 | | |

In the consideration of the marginal conditions of the pseudomorphic and defect-free growth of the silicon-germanium base during the production process, the desired step height is especially advantageously attained by the combination of the two variation options. In the illustrated embodiment, the graduation $\Delta x=6\%$ and $N_i/N_{i+1}=2$ was selected, resulting in the concentrations shown in Table 2. A further embodiment can be realized in the combination $\Delta x=4\%$ and $N_i/N_{i+1}=3$.

TABLE 2

| Step profile with N = 5 and $\Delta x$ = 6% and $N_i/N_{i+1}$ = 2: | | |
|---|---|---|
| Layer | X (%) | $N_i$ (cm$^{-3}$) |
| 1 (emitter side) | 6 | $8 \times 10^{19}$ |
| 2 | 12 | $4 \times 10^{19}$ |
| 3 | 18 | $2 \times 10^{19}$ |
| 4 | 24 | $1 \times 10^{19}$ |
| 5 | 30 | $5 \times 10^{18}$ |

Figure 3:
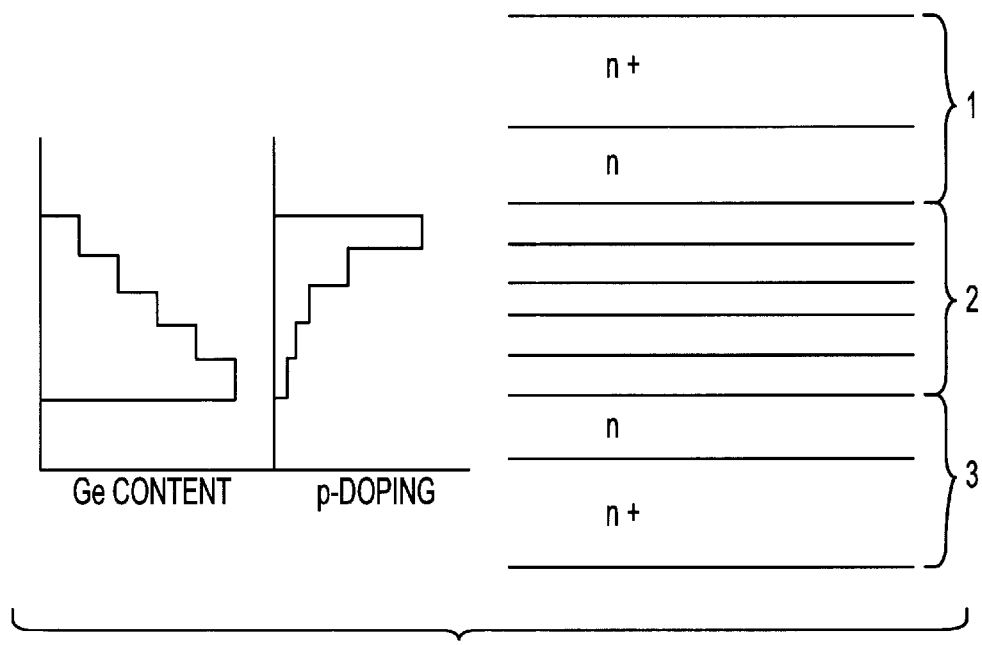
FIG. 3 shows a sequence of layers of the silicon-germanium bipolar transistor according to the invention.

The associated layer sequence of the silicon-germanium bipolar transistor according to FIG. 3 shows the graduations of the germanium concentration and, by way of example, the p-doping concentration in the base 2, both in a linear representation. The n-silicon emitter 1 with an n+ connecting layer is also shown, as is the n-silicon collector 3 with an n+ connecting layer. On the emitter side of the base, the germanium concentration is the lowest in the first step, whereas the doping concentration has its highest value here.

Figure 2:
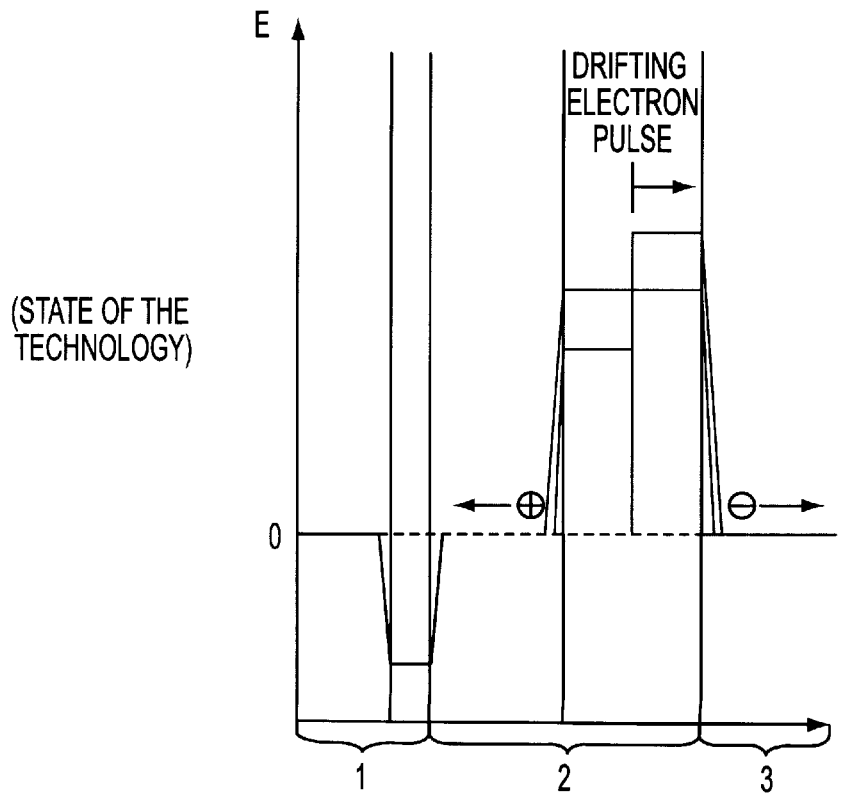
FIG. 2 shows the electrical field distribution in a bipolar transistor (state of the technology).
Figure 4:
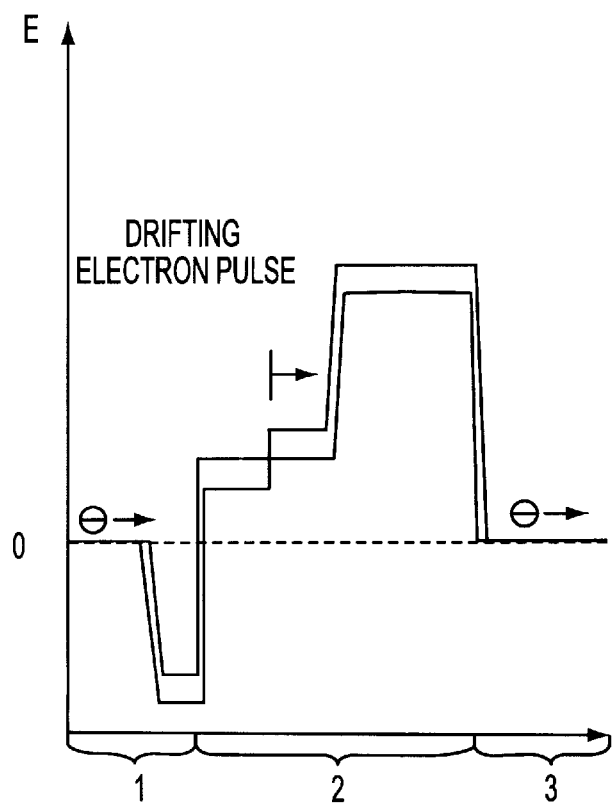
FIG. 4 is a simplified electrical field distribution of the silicon-germanium bipolar transistor according to the invention.

FIG. 4 schematically shows the effect described by the invention on the electrical field distribution on the emitter side in comparison to the state of the technology described in FIGS. 1 and 2. A modulation in the electrical field inside the base, the modulation being effected by a graduation of the potential, is not shown in FIG. 4 for the sake of a clear overview.

During the electron drift, the field intensity in the emitter-base space-charge zone steadily decreases, whereas the field intensity in the base-collector space-charge zone steadily increases. The emitter-collector potential remains constant as the sum of the emitter-base potential and the base-collector potential. Thus, electrons enter the emitter 1 in the illustrated manner, while electrons are discharged in the collector 3. The influence current then flows in the emitter-collector circuit; the base supply line remains current-free, and therefore does not contribute to the total resistance.

What is claimed is:

1. A Silicon-germanium heterobipolar transistor having a silicon emmiter (1), a silicon-germanium base (2) and a silicon collector (3), and wherein starting from the emitter (1), the base (2) includes a change in the Ge content in the from of a step wise increase, and a step-wise, but opposing, change in the doping concentration.

2. The silicon-germanium heterobipolar transistor according to claim 1, wherein the base (2) includes three to seven steps.

3. The silicon-geranium heterobipolar transistor according to claim 1, wherein the base (2) is 50 nm to 300 nm thick.

4. The silicon-germanium heterobipolar transistor according to claim 1, wherein the base (2) is embodied as steps having a Ge content between 6 and 30% and a p-doping concentration between $8\times10^{19}$ and $5\times10^{18}$ cm$^{-3}$.

* * * * *